(12) United States Patent
Yabuta

(10) Patent No.: US 9,793,883 B2
(45) Date of Patent: Oct. 17, 2017

(54) VALLEY DETECTION CIRCUIT AND DRIVE CIRCUIT

(71) Applicant: Cypress Semiconductor Corporation, San Jose, CA (US)

(72) Inventor: Shun Yabuta, Aichi (JP)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 15/276,355

(22) Filed: Sep. 26, 2016

(65) Prior Publication Data

US 2017/0093385 A1    Mar. 30, 2017

Related U.S. Application Data

(60) Provisional application No. 62/233,477, filed on Sep. 28, 2015.

(51) Int. Cl.
| | |
|---|---|
| *H03K 5/1536* | (2006.01) |
| *H03K 17/687* | (2006.01) |
| *G01R 19/175* | (2006.01) |
| *H02M 1/08* | (2006.01) |
| *H03K 17/13* | (2006.01) |

(52) U.S. Cl.
CPC ......... *H03K 5/1536* (2013.01); *G01R 19/175* (2013.01); *H02M 1/083* (2013.01); *H03K 17/133* (2013.01); *H03K 17/687* (2013.01)

(58) Field of Classification Search
CPC .. H03K 5/1532; H03K 5/1534; H03K 5/1536; G01R 19/175; H02M 1/083; H02M 2001/0054; H02M 2005/2935
See application file for complete search history.

(56) References Cited

U.S. PATENT DOCUMENTS

| | | | | | |
|---|---|---|---|---|---|
| 4,935,857 | A | * | 6/1990 | Nguyen | H02M 3/3376 363/132 |
| 5,798,665 | A | * | 8/1998 | Ichihara | H03F 1/342 327/317 |
| 6,806,727 | B2 | * | 10/2004 | Thibedeau | G01R 31/343 324/765.01 |
| 6,819,154 | B2 | * | 11/2004 | Greenfeld | H02M 1/38 327/140 |

(Continued)

OTHER PUBLICATIONS

International Search Report for International Application No. PCT/US2016/054020 dated Dec. 7, 2016; 2 pages.

(Continued)

*Primary Examiner* — Thomas J Hiltunen

(57) ABSTRACT

A technique for detecting a valley timing at lower cost is described. A drive circuit comprises a peak voltage holder, a valley voltage holder, a center voltage generator, a monitor, and a detector. The peak voltage holder holds a peak voltage of an oscillating signal that is based on a voltage at a terminal of an inductor coupled to a switching element. The valley voltage holder holds a valley voltage of the oscillating signal. The center voltage generator generates a center voltage based on the peak voltage and the valley voltage. The monitor monitors the present value of the voltage at the terminal. The detector detects, as a valley timing, a timing at which a predetermined delay time has elapsed from a timing at which the monitored present value of the voltage at the terminal has fallen below the center voltage.

20 Claims, 12 Drawing Sheets

(56) References Cited

U.S. PATENT DOCUMENTS

| | | | |
|---|---|---|---|
| 7,426,120 B2 | 9/2008 | Yang et al. | |
| 7,466,569 B2 | 12/2008 | Yang et al. | |
| 7,652,461 B2 * | 1/2010 | Tateishi | H02M 3/1588 323/284 |
| 7,710,084 B1 * | 5/2010 | Guo | G01R 19/003 323/224 |
| 7,714,556 B2 * | 5/2010 | Chu | H02M 3/1588 323/222 |
| 7,907,425 B2 | 3/2011 | Lin | |
| 8,238,477 B2 * | 8/2012 | Zocher | H03G 3/3052 327/1 |
| 8,391,027 B2 | 3/2013 | Lidak et al. | |
| 8,471,536 B2 * | 6/2013 | Wu | H02M 1/4225 323/222 |
| 8,552,695 B2 * | 10/2013 | Stracquadaini | H02M 3/33507 323/207 |
| 8,716,949 B2 * | 5/2014 | Watanabe | H05B 33/0815 315/224 |
| 8,766,617 B2 * | 7/2014 | Wan | H02M 3/1588 323/285 |
| 8,810,160 B2 * | 8/2014 | Hoogzaad | H05B 33/0818 315/224 |
| 8,952,669 B2 | 2/2015 | Chang | |
| 8,964,417 B1 | 2/2015 | Shen et al. | |
| 9,035,624 B1 * | 5/2015 | Rahimi | H02M 3/156 323/224 |
| 9,184,672 B2 * | 11/2015 | Wen | H02M 7/4807 |
| 9,370,069 B2 * | 6/2016 | Gong | H05B 33/0854 |
| 2006/0017424 A1 * | 1/2006 | Wood | H02M 3/156 323/274 |
| 2009/0190377 A1 | 7/2009 | Wang et al. | |
| 2011/0031949 A1 | 2/2011 | Zhang et al. | |
| 2014/0055107 A1 * | 2/2014 | Tsuruoka | H02M 3/156 323/234 |
| 2014/0306680 A1 * | 10/2014 | Liu | G05F 1/468 323/288 |
| 2015/0244263 A1 * | 8/2015 | Ng | H02M 3/156 323/271 |
| 2015/0303808 A1 * | 10/2015 | Ryotaro | H02M 3/1588 323/271 |
| 2016/0020692 A1 * | 1/2016 | Castelli | H02M 1/4208 363/89 |
| 2016/0285366 A1 * | 9/2016 | Lee | H05B 33/0815 |
| 2016/0308447 A1 * | 10/2016 | Chen | H02M 1/4258 |

OTHER PUBLICATIONS

Written Opinion of the International Searching Authority for International Application No. PCT/US2016/054020 dated Dec. 7, 2016; 7 pages.

* cited by examiner

VALLEY DETECTION CIRCUIT AND DRIVE CIRCUIT

CROSS-REFERENCE TO RELATED APPLICATION

This application claims the benefit and priority of U.S. Provisional Patent Application No. 62/233,477 filed on Sep. 28, 2015, which is incorporated herein by reference for all purposes.

BACKGROUND

The present invention relates to a valley detection circuit, a drive circuit, a valley detection method, and a driving method.

In a control circuit of a driver, which controls a switching power supply, the voltage at a terminal (e.g., a drain of a MOSFET (Metal-Oxide-Semiconductor Field-Effect Transistor)) of a switching element connected to one end of an inductor rises and falls while ringing when the energy of the inductor is discharged. There has been known a circuit which detects a timing at which the voltage has reached a valley voltage in the ringing, controls switching of the switching element according to the timing, and thereby controls turning ON/OFF of the driver. The valley voltage is a minimum value of the above voltage which falls while ringing. The ringing voltage reaches the valley voltage at a plurality of timings. The above switching is carried out at one timing of the timings provided to reach the valley voltage. Incidentally, the above switching element includes, for example, a bipolar transistor, an IGBT (Insulated Gate Bipolar Transistor), or a switching element using GaN/SiC, or the like in addition to the MOSFET.

A method using an auxiliary winding externally attached to a control circuit has been known to detect each timing provided to reach the valley voltage. Specifically, the auxiliary winding is externally attached to the control circuit in such a manner as to be able to monitor the voltage between a terminal of a switching element and a terminal of an inductor connected to the terminal thereof. The voltage of the externally attached auxiliary winding is monitored and the timing provided to reach the valley voltage is detected as a valley timing.

The mounting of a circuit for detecting the valley timing by monitoring the voltage of the auxiliary winding is relatively high in cost. Thus, a technique capable of detecting a valley timing at lower cost has been required.

SUMMARY

In several aspects of the present invention, it is one object to provide a technique capable of detecting a valley timing at lower cost.

A valley detection circuit according to one aspect of the present invention is equipped with a first holder configured to hold a peak voltage of an oscillating signal that is based on a voltage at a terminal of an inductor coupled to a switching element, a second holder configured to hold a valley voltage of the oscillating signal, a generator configured to generate a center voltage between the peak voltage and the valley voltage, a monitor configured to monitor at least a present value of the voltage at the terminal, and a detector configured to detect, as a valley timing, a timing at which a predetermined delay time has elapsed from a timing at which the monitored present value has fallen below the center voltage.

In the embodiments presented herein, the terms "part", "device" and "system" not only mean physical mechanisms, but also include realization of functions that the "part", "device" and "system" have, by software or firmware. The function of "part", "device" or "system" may be realized by two or more physical mechanisms or devices. Alternatively, the two or more functions of "part", "device" and "system" may be realized by one physical mechanism or device.

BRIEF DESCRIPTION OF THE DRAWINGS

The accompanying drawings are incorporated herein and form a part of the specification.

In the drawings, like reference numbers generally indicate identical or similar elements.

DETAILED DESCRIPTION

First Embodiment

Figure 1:
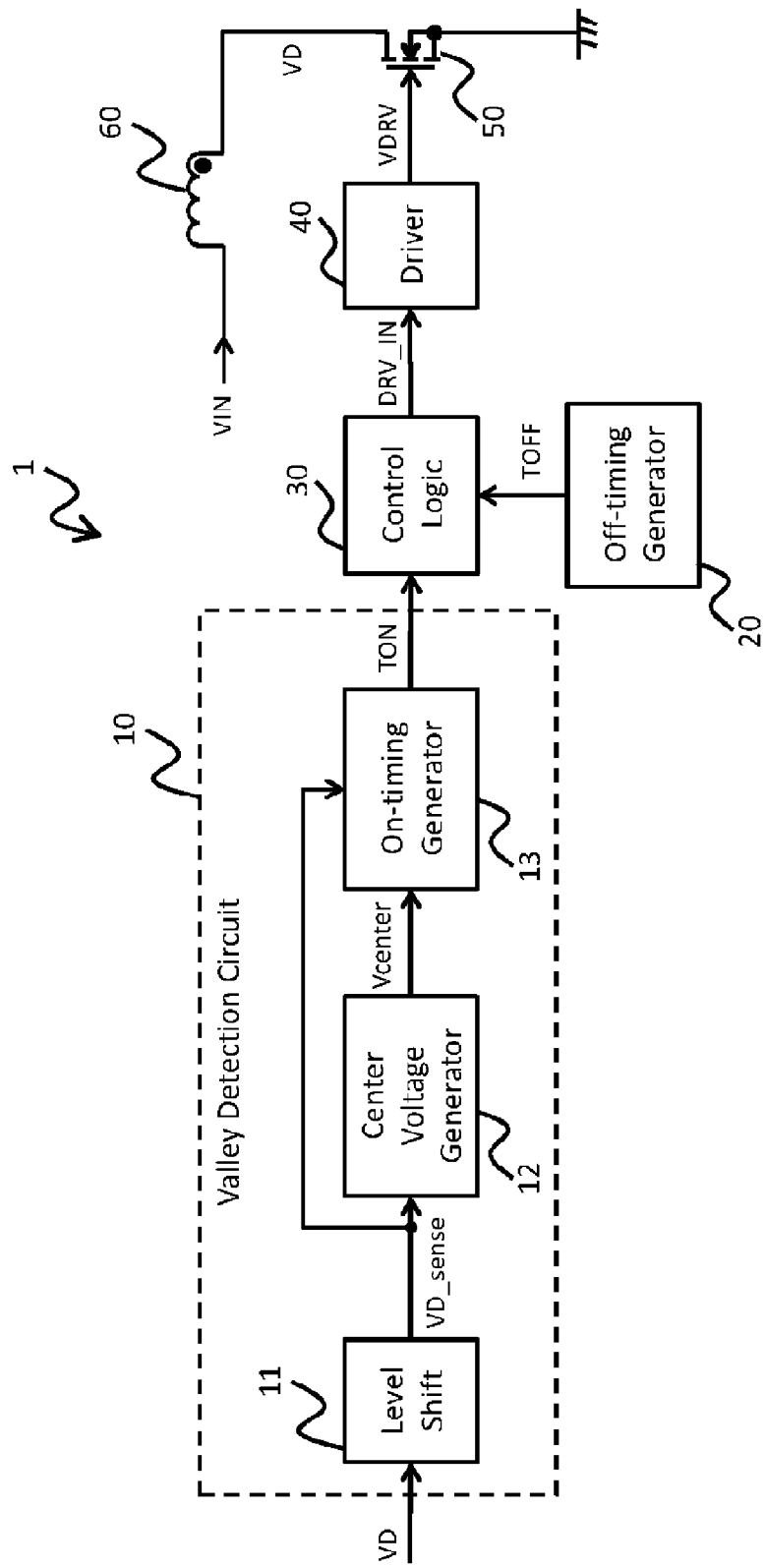
FIG. 1 is a block diagram illustrating one example of a drive circuit according to a first embodiment.

An illustrative configuration of a drive circuit equipped with a valley detection circuit according to a first embodiment will be described with reference to FIG. 1. In the present embodiment, the drive circuit 1 functions as a circuit for controlling a switching power supply of an AC/DC converter. However, the drive circuit 1 can also function as another circuit. In another embodiment, for example, the drive circuit 1 can function as a drive circuit of an AC/DC LED driver or a DC/DC converter.

The drive circuit 1 is configured to include a valley detection circuit 10, an off-timing generator 20, a control logic 30, a driver 40, a switching element 50, and an inductor 60. Further, the valley detection circuit 10 is configured to include a level shift 11, a center voltage generator 12, and an on-timing generator 13.

The valley detection circuit 10 has a terminal at which a drain voltage VD of the switching element 50, configured to include a MOSFET (Metal-Oxide-Semiconductor Field-Effect Transistor), is received as an input. Here, when the energy of the inductor 60 used as a primary inductor of a transformer is discharged, the drain voltage VD of the switching element 50 connected to one end of the inductor 60 rises and falls while ringing and/or oscillating. Further, in the present embodiment, the switching element 50 is configured to include the MOSFET, but not limited to it. The switching element 50 can be configured using other switching elements such as a bipolar transistor, an IGBT (Insulated Gate Bipolar Transistor), or a switching element using GaN/SiC, etc. In this case, the voltage of a terminal (among terminals of the switching element 50) connected to the inductor 60 can be substituted with the drain voltage VD in the present embodiment.

Further, the valley detection circuit 10 has a terminal for outputting an on-timing signal TON for the switching element 50 to the control logic 30 at a predetermined timing. The on-timing signal TON is generated by the valley detection circuit 10 based on the input drain voltage VD. The valley detection circuit 10 detects, as a valley timing, each timing at which the drain voltage VD is falling while ringing/oscillating reaches a valley voltage, and generates an on-timing signal TON according to the detected valley timing.

The level shift 11 shifts the input drain voltage VD to a lower voltage and outputs the shifted voltage VD_sense. The level shift 11 can shift, for example, a drain voltage VD of 100V to 5V. The shifting of the voltage by the level shift 11 can be realized by, for example, resistance voltage division. That is, the level shift 11 can function as a voltage divider which divides the drain voltage VD.

Figure 2:
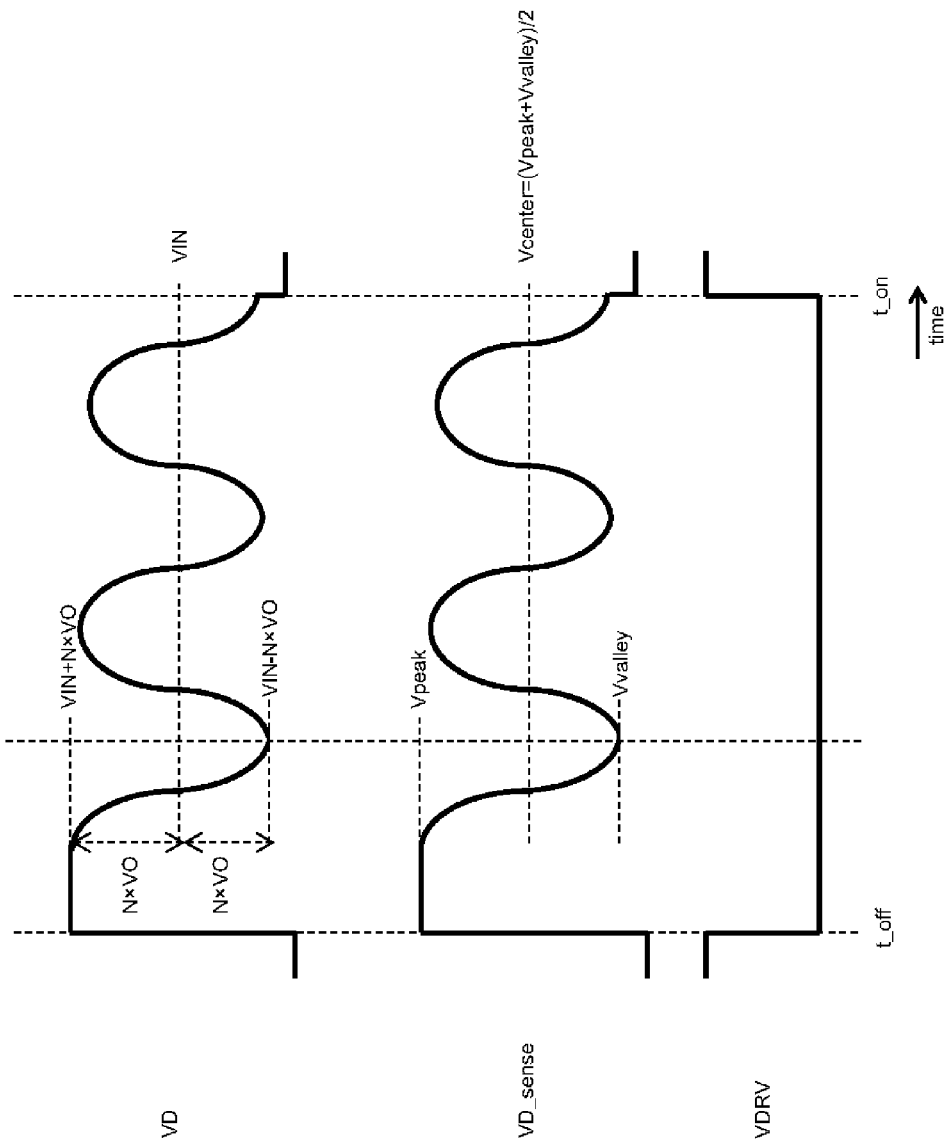
FIG. 2 is a diagram illustrating a relationship between a drain voltage VD and a voltage VD_sense in the first embodiment.

A relationship between the drain voltage VD and the voltage VD_sense will further be described with reference to FIG. 2. FIG. 2 illustrates in graphs, values obtained by respectively monitoring the drain voltage VD and the voltage VD_sense. When the inductor 60 is a primary inductor of a flyback type transformer, the amplitude of ringing/oscillating in the drain voltage VD is proportional to a turn ratio N of the primary winding and the secondary winding of the transformer with an input voltage VIN into the inductor 60 as a center voltage. Specifically, the peak voltage and the valley voltage in ringing/oscillating are represented as follows:

Peak voltage=input voltage $VIN$+(turn ratio $N$×output voltage $VO$)

Valley voltage=input voltage $VIN$−(turn ratio $N$×output voltage $VO$)

Since the voltage VD_sense is the voltage obtained by shifting the drain voltage VD, the waveform of the voltage VD_sense as illustrated in FIG. 2 changes in a similar shape at a timing similar to that taken for the waveform of the drain voltage VD. That is, the timing at which the voltage VD_sense reaches the peak voltage Vpeak and the valley voltage Vvalley coincides with that timing at which the drain voltage VD reaches the peak voltage and the valley voltage.

Referring back to the description of FIG. 1, the center voltage generator 12 first monitors the voltage VD_sense inputted from the level shift 11 and detects its peak voltage Vpeak and valley voltage Vvalley. The center voltage generator 12 generates a center voltage (=(Vpeak+Vvalley)/2) between the detected peak voltage Vpeak and valley voltage Vvalley and outputs the generated voltage as a center voltage Vcenter.

Figure 3A:
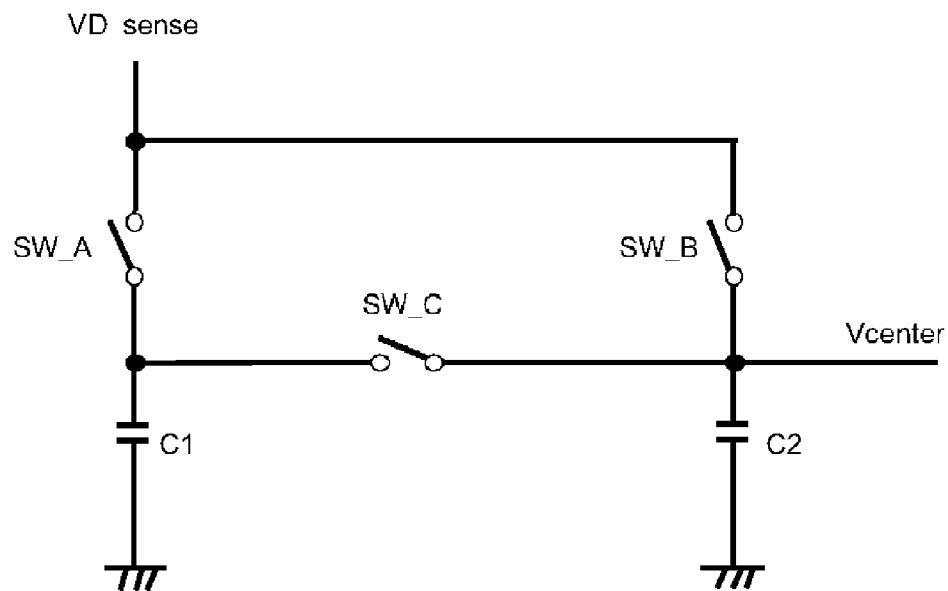
FIG. 3A is a diagram for describing a center voltage generator according to the first embodiment.
Figure 3B:
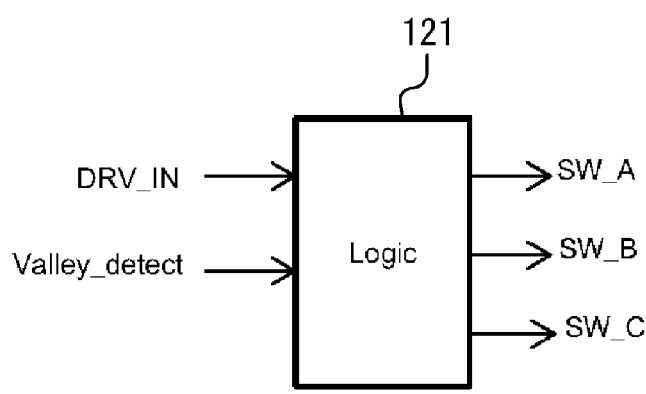
FIG. 3B is a diagram for describing the center voltage generator according to the first embodiment.

An example configuration of the center voltage generator 12, and processing thereof, will be described with reference to FIG. 3A and FIG. 3B. The center voltage generator 12 has switches SW_A, SW_B, and SW_C, and capacitors C1 and C2. Here, the capacitance values of the capacitors C1 and C2 are equal to each other. Further, the center voltage generator 12 has a logic 121 for controlling turning ON/OFF of the switches SW_A, SW_B, and SW_C. The logic 121 performs control corresponding to a signal DRV_IN and a signal Valley_detect.

As will be described later, the signal DRV_IN is outputted from the control logic 30. The signal DRV_IN becomes a High signal while the driver 40 is turned ON, and becomes a Low signal while the driver 40 is turned OFF. Further, as will be described below, the signal Valley_detect is outputted from a delay generator 142. The signal Valley_detect becomes a High signal at a timing at which the valley voltage Vvalley is detected, and becomes a Low signal during other periods.

As to control on the switches SW_A, SW_B, and SW_C, initial states are SW_A=ON, SW_ON, and SW_C=OFF. In order to hold the peak voltage Vpeak by the capacitor C1, the states of the respective switches are set to SW_A=OFF, SW_B=ON, and SW_C=OFF, based on the timing at which the signal DRV_IN becomes Low. For example, after a constant period of time (e.g., 100 nsec) has elapsed from the timing at which the signal DRV_IN becomes Low, the state of each switch can be switched as described above. At this time, the capacitor C1 functions as a first holder which holds the peak voltage Vpeak.

Thereafter, in order to hold the valley voltage Vvalley by the capacitor C2, the states of the respective switches are set to SW_A=OFF, SW_B=OFF, and SW_C=OFF at the timing at which the signal Valley_detect first becomes High in the above ringing/oscillating. At this time, the capacitor C2 functions as a second holder which holds the valley voltage Vvalley.

In order to generate the center voltage Vcenter, the states of the respective switches are thereafter set to SW_A=OFF, SW_B=OFF, and SW_C=ON. The voltages of the capacitors C1 and C2 become equal to each other, and hence the center voltage Vcenter (=(Vpeak+Vvalley)/2) is generated and outputted. At this time, the center voltage generator 12 functions as a generator which generates the center voltage Vcenter.

Referring back to the description of FIG. 1, the on-timing generator 13 outputs the above-described on-timing signal TON at a timing determined based on the voltage VD_sense and the output from the center voltage generator 12 in order to turn ON the switching element 50.

Figure 4:
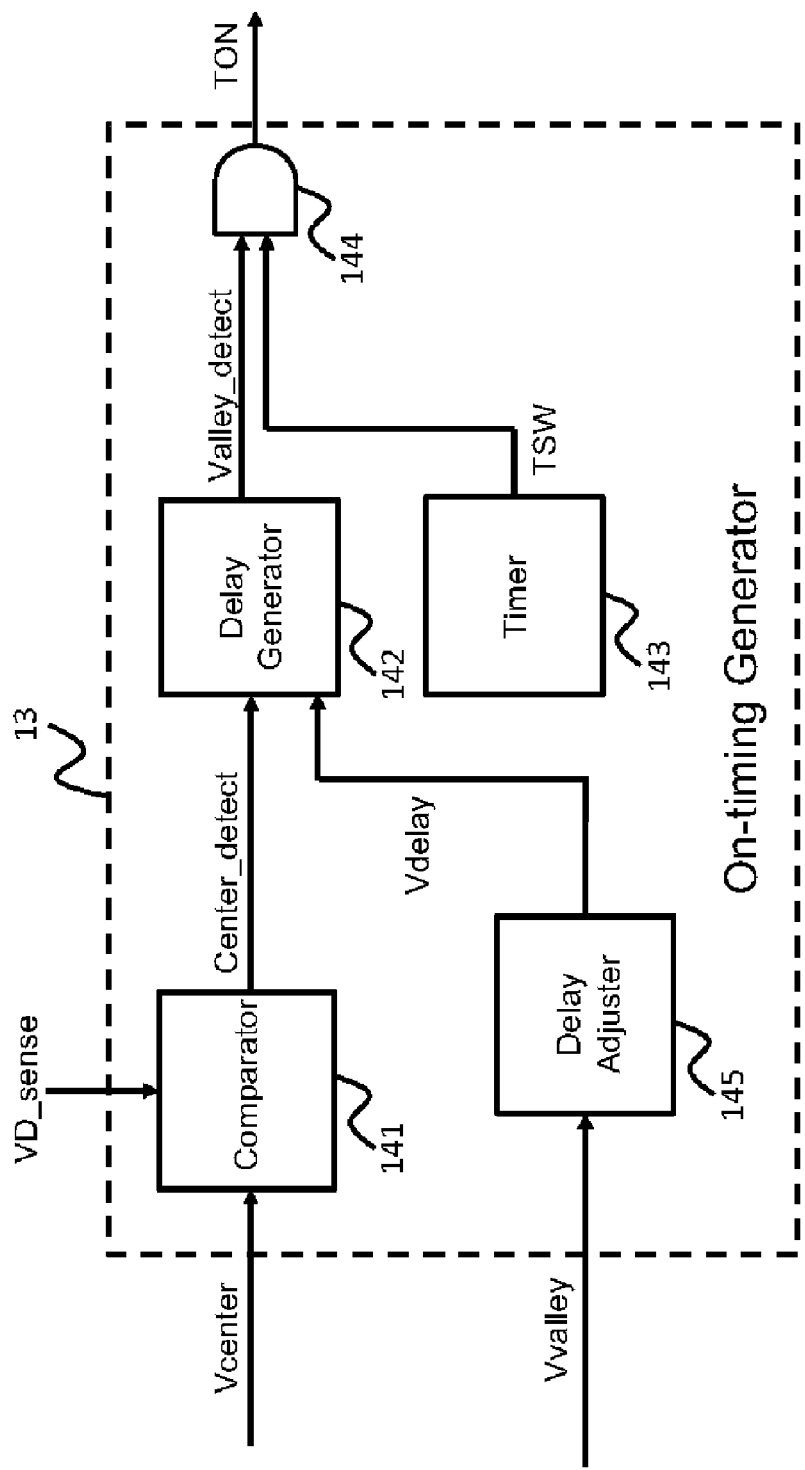
FIG. 4 is a diagram for describing an on-timing generator according to the first embodiment.

An example configuration of the on-timing generator 13, and its processing, will be described with reference to FIG. 4. The on-timing generator 13 includes a comparator 141, a delay generator 142, a timer 143, an AND gate 144, and a delay adjuster 145.

The comparator 141 monitors the present value of the voltage VD_sense and compares the monitored value of voltage VD_sense and the value of the center voltage Vcenter. That is, the comparator 141 functions as a monitor which monitors the present value of the voltage (voltage VD_sense) based on the drain voltage VD. The comparator 141 outputs a signal Center_detect at High for a constant period at a timing at which the value of the voltage VD_sense falls below the value of the center voltage Vcenter.

The delay adjuster 145 adjusts the value of a time Tdelay set in advance as the time taken for the voltage VD_sense to drop from the voltage Vcenter to the voltage Vvalley. Further, the delay adjuster 145 outputs a voltage Vdelay corresponding to the value of the adjusted time Tdelay. The details of processing in the delay adjuster 145 will be described below.

The delay generator 142 outputs a signal Valley_detect indicating the valley voltage Vvalley has been detected, based on the voltage Vdelay, at High for a constant period at a timing at which the above-described time Tdelay has elapsed from the timing at which the signal Center_detect is outputted at High. As described above, the timing at which the voltage VD_sense reaches the valley voltage Vvalley coincides with the timing at which the drain voltage VD reaches the valley voltage. Thus, the delay generator 142 functions as a detector which detects the timing at which the time Tdelay has elapsed from the timing at which the signal Center_detect is outputted at High, to thereby detect a timing (valley timing) at which the drain voltage VD reaches the valley voltage. The details of processing by the delay generator 142 will be described below.

The timer 143 outputs a signal TSW at High each time a cycle limiting time Tsw set in advance elapses from when the switching element 50 was turned ON the last time. When the signal Valley_detect is given as High from the delay generator 142, and a signal TSW for the cycle limiting time Tsw is given as High from the timer 143, the AND gate 144 outputs an on-timing signal TON for the switching element 50 at High. Incidentally, the value of the cycle limiting time Tsw is set to prevent the frequency for the switching of the switching element 50 from excessively increasing. The cycle limiting time Tsw can be set to, for example, 7.5 μsec.

Referring back to the description of FIG. 1, the off-timing generator 20 outputs an off-timing signal TOFF for the switching element 50 to the control logic 30. In order to generate the off-timing signal TOFF, the off-timing generator 20 can adopt an arbitrary method.

The control logic 30 has a terminal to which the on-timing signal TON is inputted, and a terminal to which the off-timing signal TOFF is inputted. Further, the control logic 30 has a terminal provided to output a control signal DRV_IN generated based on the on-timing signal TON and the off-timing signal TOFF to the driver 40 in order to control the driver 40.

The driver 40 is a driver which controls switching of the switching element 50. The driver 40 has a terminal to which the control signal DRV_IN outputted from the control logic 30 is inputted, and an output terminal for applying a voltage VDRV to a gate of the switching element 50 according to the input control signal DRV_IN and thereby turning ON or OFF the switching element 50. That is, the control logic 30 functions as an outputter for outputting the control signal for turning ON or OFF the switching element 50.

The switching element 50 is configured to include the MOSFET as described above and may be configured, for example, as an n channel type MOSFET. A drain of the switching element 50 is connected to the inductor 60, and a source thereof is connected to ground.

The inductor 60 has a terminal connected to the drain of the switching element 50 and a terminal to which the input voltage VIN is inputted. The inductor 60 accumulates energy while the switching element 50 is ON, and discharges the energy while the switching element 50 is OFF. The inductor 60 is configured as the primary inductor of the transformer as described above. The inductor 60 can, however, be configured as inductors for other applications. For example, the inductor 60 can be configured as an inductor for supplying energy to an LED (Light Emitting Diode). At this time, the input voltage VIN may be AC or DC.

Figure 5:
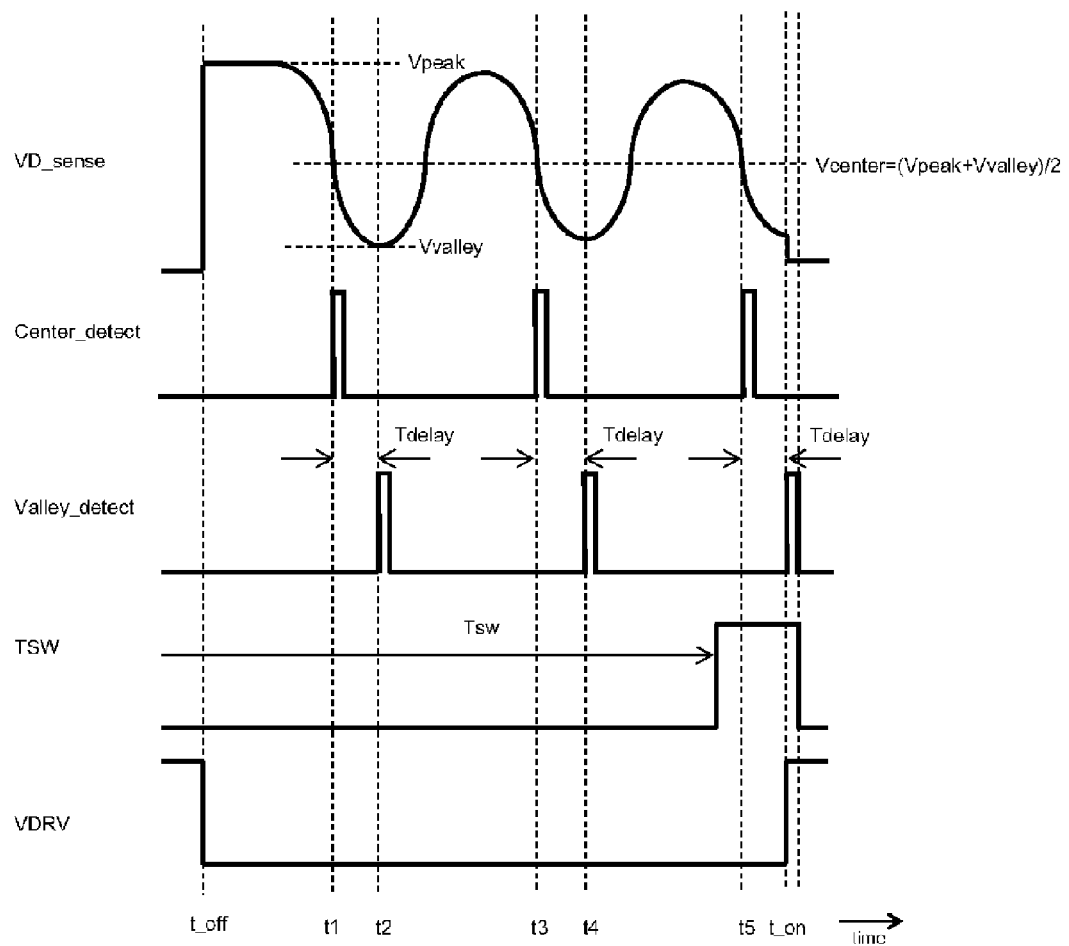
FIG. 5 is a waveform diagram for describing an example of detecting a valley timing in ringing of the drain voltage VD according to the first embodiment.

An example of detecting a valley timing in ringing/oscillating of the drain voltage VD by the valley detection circuit 10 will be described with reference to FIG. 5. FIG. 5 illustrates an example of detecting a valley timing in an Nth cycle (where N is an integer greater than 3) when one cycle is set from when to turn OFF the switching element 50 to turn ON the switching element 50.

When the switching element 50 is turned OFF by stopping the application of the voltage VDRV to the gate of the switching element 50 at a time t_off, and thereafter the energy of the inductor 60 is discharged, ringing/oscillating with an amplitude formed between the peak voltage Vpeak and the valley voltage Vvalley occurs in the voltage VD_sense.

The output of the signal Center_detect from the comparator 141 becomes High for a constant period at the timing at which the value of the voltage VD_sense falls below the value of the center voltage Vcenter. The example of FIG. 5 illustrates that the output of the signal Center_detect becomes High for the constant period at times t1, t3, and t5. Incidentally, in order to generate the center voltage Vcenter in the Nth cycle, a peak voltage Vpeak and a valley voltage Vvalley in an N−1th cycle are used. Incidentally, in a first cycle, values set in advance as the peak voltage Vpeak and the valley voltage Vvalley are used to generate the center voltage Vcenter. Alternatively, in the first cycle, a value set in advance as the center voltage Vcenter may be used without generating the center voltage Vcenter.

At a timing at which a time Tdelay has elapsed from the timing at which the output of the signal Center_detect becomes High for the constant period, a signal Valley_detect indicating that the valley voltage Vvalley has been detected is outputted from the delay generator 142 at High for a constant period. The example of FIG. 5 illustrates that the signal Valley_detect is outputted at High for a constant period at times t2, t4, and t_on. Incidentally, as described above, the time Tdelay is a time set and adjusted in advance as the time required for the voltage VD_sense to drop from the voltage Vcenter to the voltage Vvalley. A method of adjusting the value set to the time Tdelay will be described below.

The driver 40 applies the voltage VDRV to the gate of the switching element 50 at High at a timing at which the cycle limiting time Tsw elapses from when the switching element 50 was turned ON the last time, and the signal Valley_detect is outputted. In the example of FIG. 5, the voltage VDRV is applied at High at the timing of the time t_on.

With the voltage VDRV being applied to the gate of the switching element 50 at High, the switching element 50 is turned ON.

Figure 6:
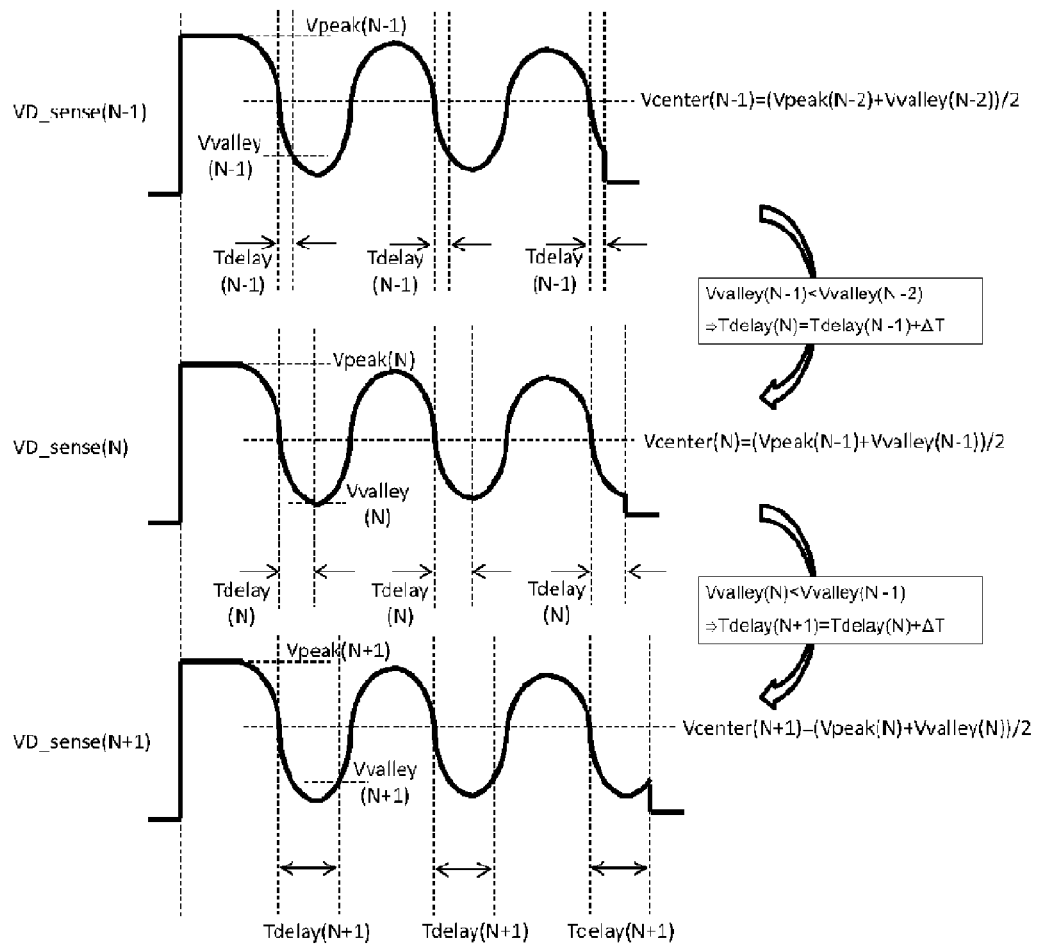
FIG. 6 is a diagram for describing a method for adjusting a value set to a time Tdelay in the first embodiment.

The method of adjusting the value set to the time Tdelay will next be described with reference to FIG. 6. FIG. 6 illustrates ringing of a voltage VD_sense (N−1), a voltage VD_sense (N), and a voltage VD_sense (N+1) corresponding to voltages VD_sense in an N−1 cycle, an Nth cycle, and an N+1th cycle, respectively, of switching by the switching element 50.

In this example, a center voltage Vcenter is generated using a peak voltage Vpeak and a valley voltage Vvalley in the previous cycle. Thus, for example, a center voltage Vcenter (N) in the Nth cycle is generated using a peak voltage Vpeak (N−1) and a valley voltage Vvalley (N−1) in the N−1th cycle.

Further, the delay adjuster 145 uses a valley voltage Vvalley in the previous cycle and a valley voltage Vvalley in a two-previous cycle to adjust the value set to the time Tdelay. Thus, for example, a valley voltage Vvalley (N) in the Nth cycle and a valley voltage Vvalley (N−1) in the N−1th cycle are used to adjust the value of a time Tdelay (N+1) used in the N+1th cycle. Specifically, the delay adjuster 145 first compares the valley voltage Vvalley (N−1) in the N−1th cycle and the valley voltage Vvalley (N) in the Nth cycle. When Vvalley (N)<Vvalley (N−1) as illustrated in FIG. 6, a value obtained by slightly increasing the value of the time Tdelay (N) (increasing the same by 10 nsec, for example) is taken as the time Tdelay (N+1). Incidentally, in the first and second cycles, the values set in advance are used as the center voltage Vcenter and the time Tdelay.

Figure 7:
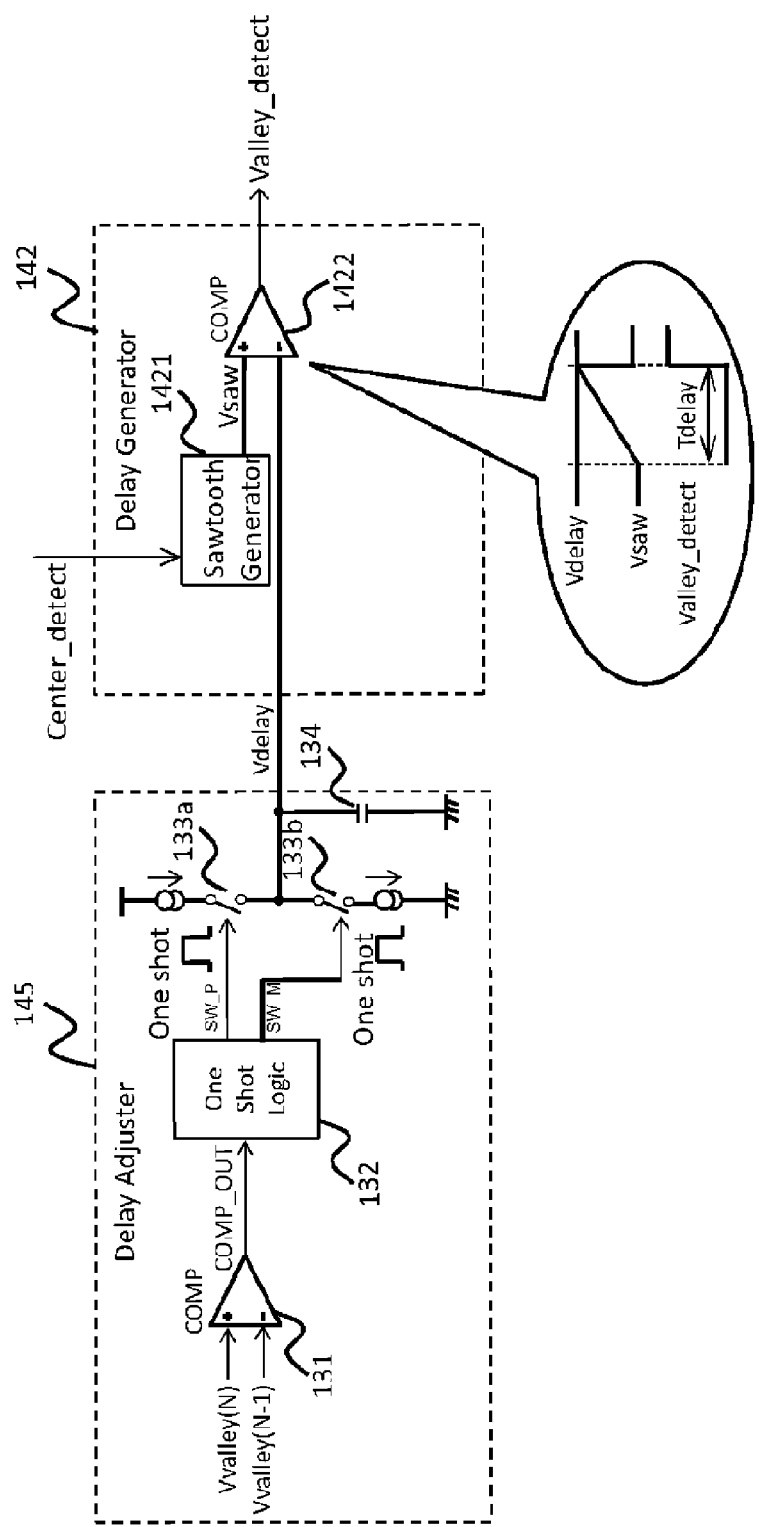
FIG. 7 is a diagram for describing a delay adjuster and a delay generator according to the first embodiment.

An example of a specific configuration of the delay adjuster 145 and the delay generator 142 for realizing processing for the adjustment in the value of the delay Tdelay and the detection of the valley voltage Vvalley will be described with reference to FIG. 7.

The delay adjuster 145 is configured to include a comparator 131, a one shot logic 132, a switch 133a, a switch 133b, and a capacitor 134. The delay generator 142 is configured to include a sawtooth generator 1421 and a comparator 1422.

The comparator 131 compares the valley voltage Vvalley (N) in the Nth cycle and the valley voltage (N−1) in the N−1th cycle and outputs a comparison result COMP_OUT. When the comparison result COMP_OUT indicates that the value of the valley voltage Vvalley (N) is high, an adjustment in the value of the time Tdelay in the Nth cycle is performed in the direction different from an adjustment in the value thereof in the N−1th cycle. For example, when the value of the time Tdelay is adjusted so as to increase in the N−1th cycle, the value of the time Tdelay is adjusted so as to decrease in the Nth cycle. Further, when the comparison result COMP_OUT indicates that the value of the valley voltage Vvalley (N) is low, an adjustment in the value of the time Tdelay in the Nth cycle is performed in the same direction as the adjustment in the value thereof in the N−1th cycle. For example, when the value of the time Tdelay is adjusted so as to increase in the N−1th cycle, the value of the time Tdelay is adjusted so as to increase even in the Nth cycle.

In order to make an adjustment to increase the value of the time Tdelay, the one shot logic 132 outputs a signal SW_P at High for a constant period of time. While the signal SW_P is being outputted at High, the switch 133a is turned ON so that an electric charge is accumulated in the capacitor 134. That is, the signal SW_P is outputted at High, so that a voltage Vdelay corresponding to the electric charge accumulated in the capacitor 134 is raised.

In order to make an adjustment to decrease the value of the time Tdelay, the one shot logic 132 outputs a signal SW_M at High for a constant period of time. While the signal SW_M is being outputted at High, the switch 133b is turned ON so that an electric charge accumulated in the capacitor 134 is discharged. That is, the signal SW_M is outputted at High, so that a voltage Vdelay corresponding to the electric charge accumulated in the capacitor 134 is decreased.

The sawtooth generator 1421 outputs a voltage Vsaw whose value changes in a sawtooth form. The comparator 1422 compares the voltage Vsaw and the voltage Vdelay corresponding to the electric charge accumulated in the capacitor 134 and outputs a signal Valley_detect at High for a constant period of time at a timing at which the value of the voltage Vsaw exceeds the value of the voltage Vdelay. A period from the time when the value of the voltage Vsaw begins to rise to the time when the value thereof exceeds the value of the voltage Vdelay becomes a time Tdelay.

According to the present embodiment as described above, by an inexpensive configuration of the capacitor or the like, the peak voltage Vpeak of the voltage VD_sense and the valley voltage Vvalley thereof are held, and the center voltage Vcenter is generated. Thereafter the timing, at which the time Tdelay has elapsed from the timing at which the voltage VD_sense falls below the center voltage Vcenter, is detected as the valley timing. Thus, according to the present embodiment, the valley timing can be detected with a more inexpensive configuration as compared with the method of monitoring the voltage of the externally-attached auxiliary winding to thereby detect the valley timing in ringing/oscillating generated in the drain voltage of the switching element 50.

Second Embodiment

A second embodiment will be described below. An example configuration, different from that of the first embodiment, that is illustrative of several configurations of the second embodiment will principally be described, and the description of the configuration similar to the first embodiment will be omitted.

Figure 8:
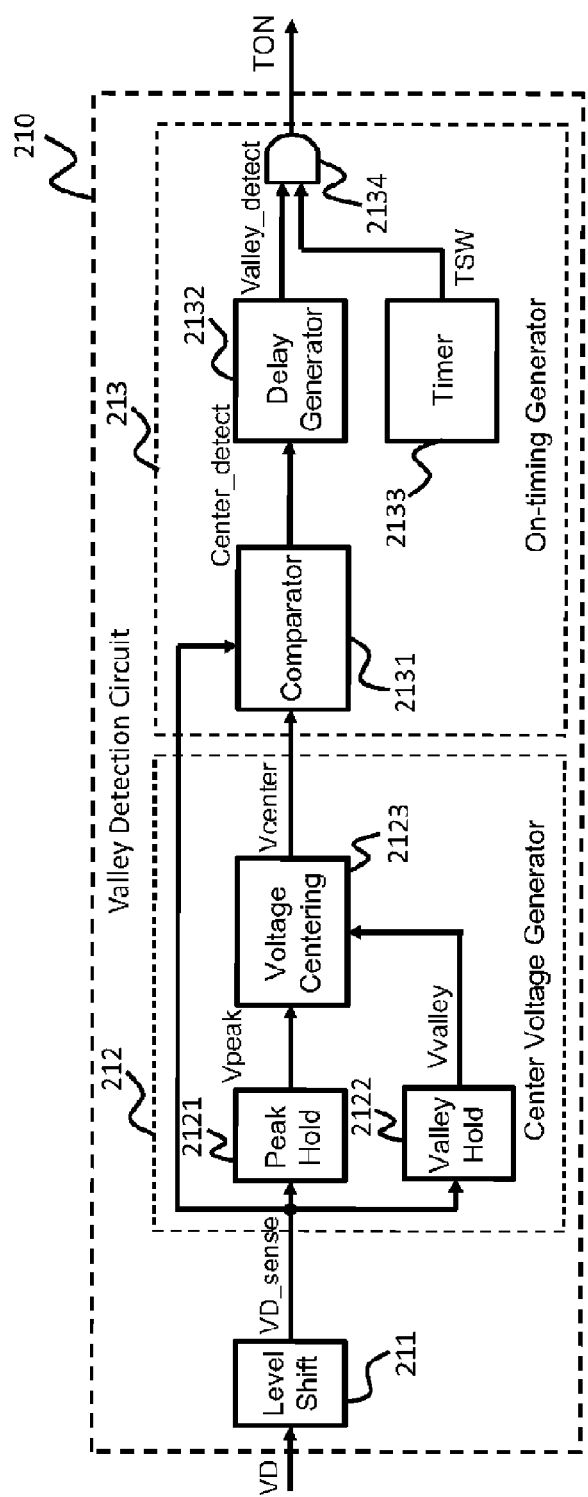
FIG. 8 is a block diagram illustrating one example of a valley detection circuit according to a second embodiment.

An example configuration of a valley detection circuit according to the second embodiment will first be described with reference to FIG. 8. The valley detection circuit 210 can be used in the drive circuit 1 illustrated in FIG. 1 in the first embodiment, instead of the valley detection circuit 10. The valley detection circuit 210 is configured to include a level shift 211, a center voltage generator 212, and an on-timing generator 213.

The center voltage generator 212 is configured to include a peak hold 2121, a valley hold 2122, and a voltage centering 2123. The center voltage generator 12 in the first embodiment used the peak voltage Vpeak and the valley voltage Vvalley in the N−1th cycle to generate the center voltage Vcenter in the Nth cycle. On the other hand, the center voltage generator 212 in the second embodiment uses the peak voltage Vpeak and the valley voltage Vvalley in the Nth cycle to generate the center voltage Vcenter in the Nth cycle. The details of each configuration of the center voltage generator 212 will be described below.

The on-timing generator 213 is configured to include a comparator 2131, a delay generator 2132, a timer 2133, and an AND gate 2134. The delay generator 142 in the first embodiment used the time Tdelay adjusted by the delay adjuster 145 to output the signal Vvalley_detect indicating that the valley voltage Vvalley has been detected. On the other hand, in the second embodiment, the on-timing generator 213 does not have the configuration corresponding to the delay adjuster 145 and does not adjust the value of the time Tdelay. The delay generator 2132 outputs a signal Valley_detect as the time Tdelay using a value that is set in advance. The time Tdelay is calculated by the following equation, using an inductance L of the transformer and a drain capacitance C of the switching element 50.

$$T\text{delay}=2\pi\sqrt{(LC)}/4$$

A drive circuit according to the second embodiment can, for example, be used by calculating and setting the time Tdelay in advance when the inductance L of the transformer and the drain capacitance C of the switching element 50 are already known.

Since the comparator 2131, the timer 2133, and the AND gate 2134 respectively perform processing similar to the comparator 141, the timer 143, and the AND gate 144 in the first embodiment, the description thereof herein will be omitted.

Figure 9:
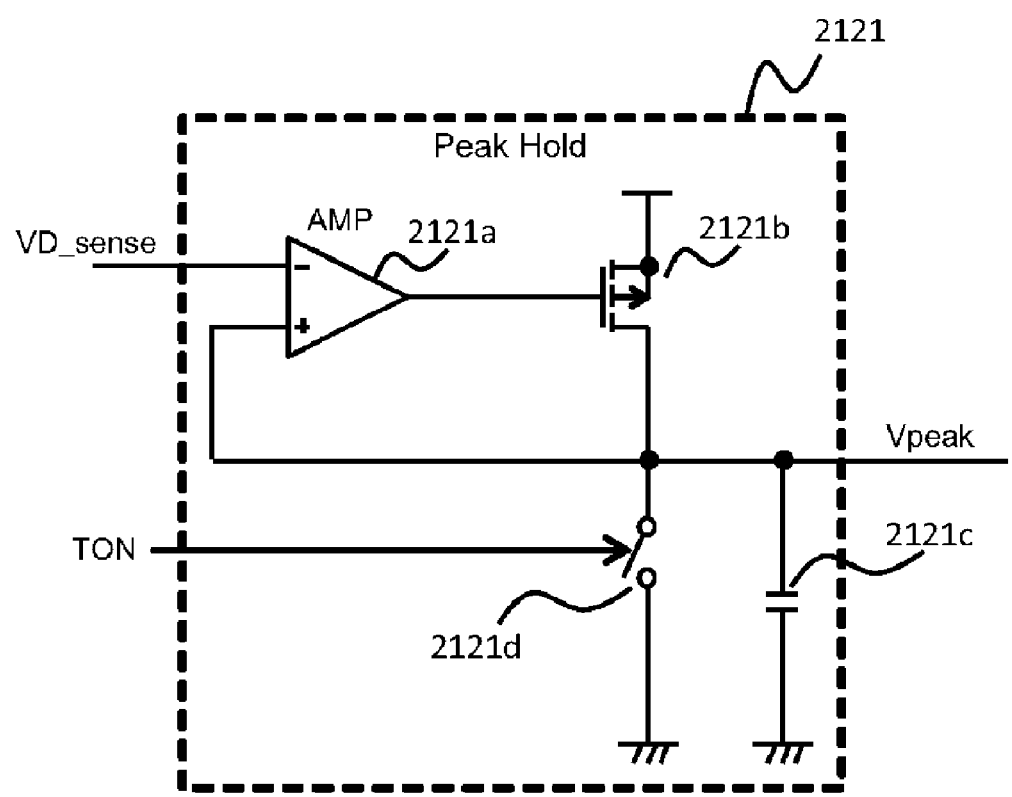
FIG. 9 is a diagram for describing a peak hold according to the second embodiment.

The configuration of the peak hold 2121 will be described with reference to FIG. 9. The peak hold 2121 is configured to include an op amplifier 2121a, a MOSFET 2121b, a capacitor 2121c, and a switch 2121d as illustrated in the same figure.

The switch 2121d is turned ON while the on-timing signal TON is being outputted from the AND gate 2134 for a preset time, so that the voltage held in the capacitor 2121c is reset to a ground voltage. The op amplifier 2121a compares the voltage VD_sense outputted from the level shift 211 and the voltage based on the electric charge accumulated in the capacitor 2121c. The electric charge is accumulated in the capacitor 2121c while the value of the voltage VD_sense is higher than the voltage based on the electric charge accumulated in the capacitor 2121c. The voltage based on the electric charge accumulated in the capacitor 2121c becomes the peak voltage Vpeak. That is, the capacitor 2121c functions as a first holder which holds the peak voltage Vpeak, like the capacitor C1 in the first embodiment.

Figure 10:
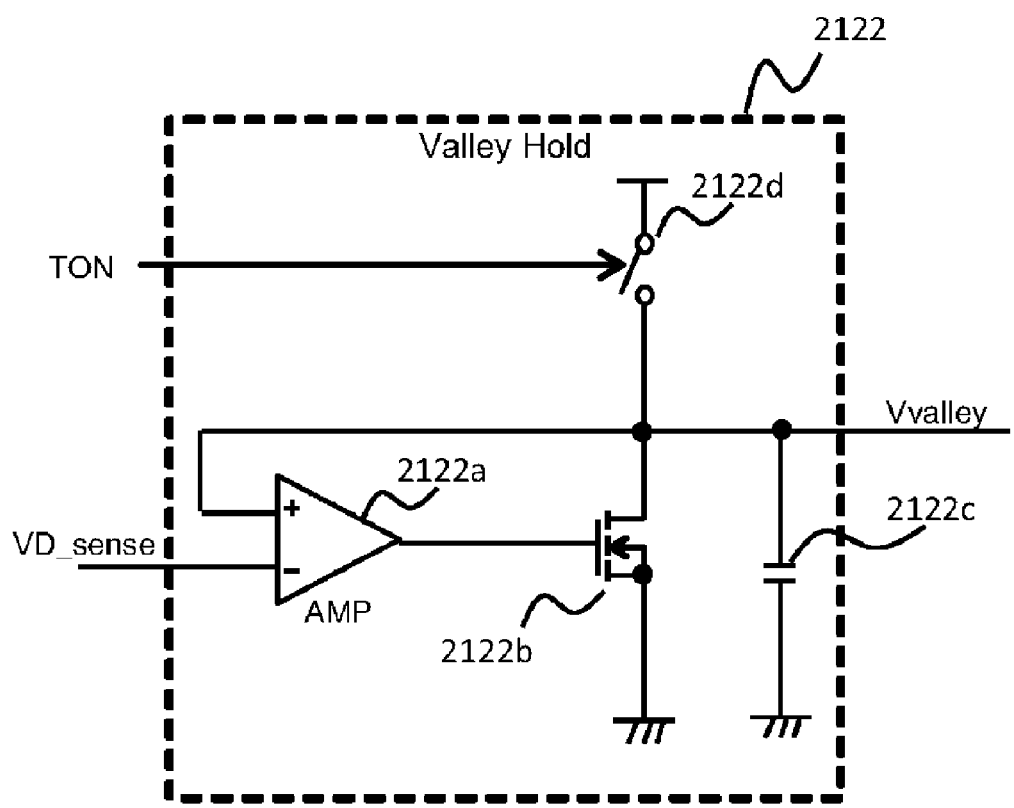
FIG. 10 is a diagram for describing a valley hold according to the second embodiment.

The configuration of the valley hold 2122 will be described with reference to FIG. 10. The valley hold 2122 is equipped with an op amplifier 2122a, a MOSFET 2122b, a capacitor 2122c, and a switch 2122d as illustrated in the same figure.

While the on-timing signal TON is being outputted for a preset period, the switch 2122d is first turned ON so that an electric charge is accumulated in the capacitor 2122c until a control circuit power supply voltage is reached. Thus, the voltage held in the capacitor 2122c is reset. The op amplifier 2122a compares the voltage VD_sense outputted from the level shift 211 and the voltage based on the electric charge accumulated in the capacitor 2122c. While the value of the voltage VD_sense is lower than the voltage based on the electric charge accumulated in the capacitor 2122c, the electric charge accumulated in the capacitor 2122c is discharged so that the voltage of the capacitor 2122c becomes the valley voltage Vvalley. The capacitor 2122c functions as a second holder which holds the valley voltage Vvalley, like the capacitor C2 in the first embodiment.

Figure 11:
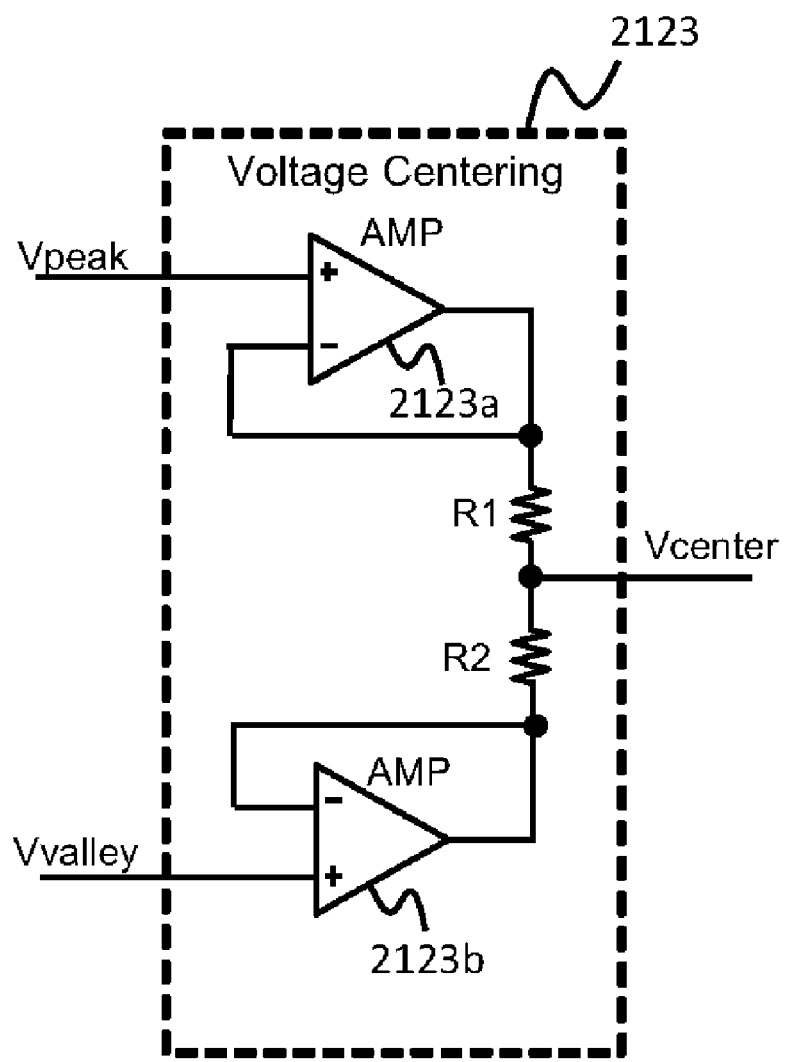
FIG. 11 is a diagram for describing a voltage centering according to the second embodiment.

The configuration of the voltage centering 2123 will be described with reference to FIG. 11. The voltage centering 2123 has an op amplifier 2123a, an op amplifier 2123b, a resistor R1, and a resistor R2 as illustrated in the same figure.

The peak voltage Vpeak is connected to a non-inversion input terminal of the op amplifier 2123a, and an output terminal of the op amplifier 2123a is connected to an inversion input terminal thereof, whereby a feedback circuit is configured. The output of the op amplifier 2123a becomes the peak voltage Vpeak and is connected to the resistor R1. The valley voltage Vvalley is connected to a non-inversion input terminal of the op amplifier 2123b, and an output terminal of the op amplifier 2123b is connected to an inversion input terminal thereof, whereby a feedback circuit is configured. The output of the op amplifier 2123b becomes the valley voltage Vvalley and is connected to the resistor R2. The resistors R1 and R2 have the same resistance value. Further, the resistors R1 and R2 are connected in series. At this time, the voltage centering 2123 outputs the center voltage Vcenter (=(Vpeak+Vvalley)/2) through a node provided between the resistors R1 and R2. In other words, the voltage centering 2123 functions as a generator which generates the center voltage Vcenter, like the center voltage generator 12 in the first embodiment.

Figure 12:
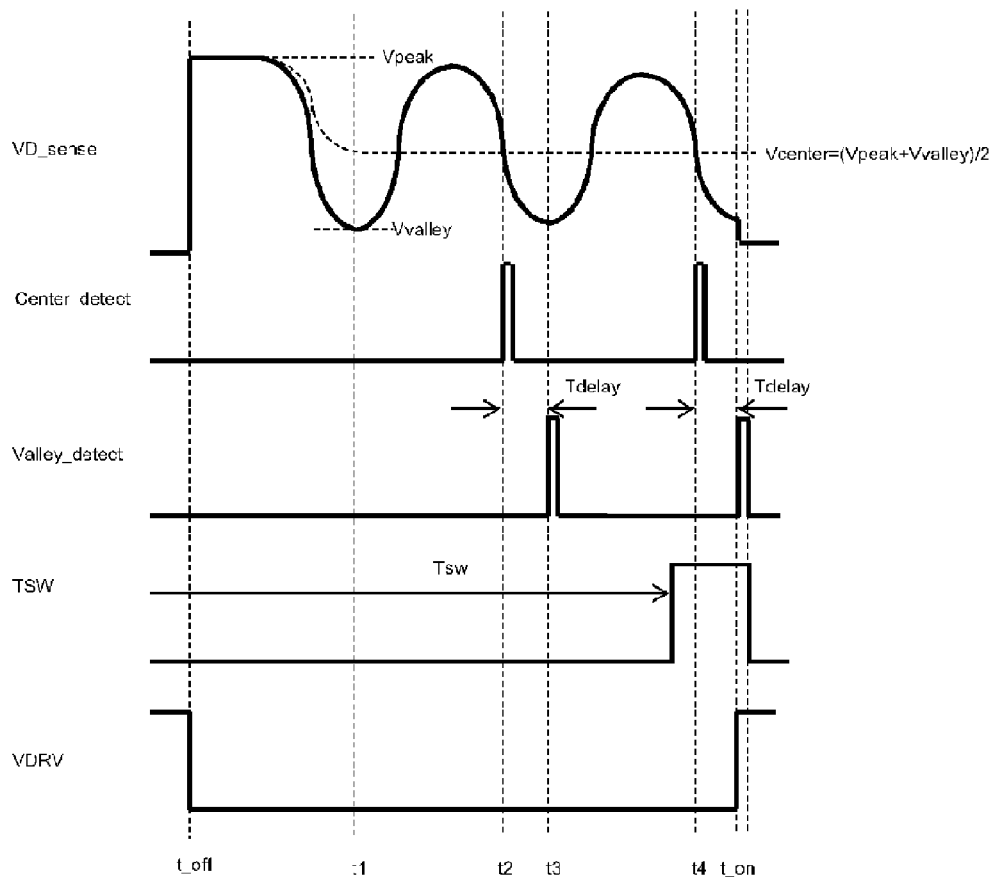
FIG. 12 is a waveform diagram for describing an example of detecting a valley timing in ringing of a drain voltage VD according to the second embodiment.

An example of detecting a valley voltage in ringing of the drain voltage VD by the valley detection circuit 210 will be described with reference to FIG. 12. FIG. 12 illustrates an example of detecting a valley voltage in an Nth cycle when one cycle is set from when to turn OFF the switching element 50 to turn ON the switching element 50. Differences from the example described with reference to FIG. 5 in the first embodiment will be mainly described.

As described above, the center voltage generator 212 in the second embodiment uses the peak voltage Vpeak and the valley voltage Vvalley in the Nth cycle to generate the center voltage Vcenter in the Nth cycle. The valley voltage Vvalley is held at the first valley in the ringing of the voltage VD_sense by the circuit described with reference to FIG. 10. Thus, the output of a signal Center_detect first becomes High for a constant period at a time t2 at which the voltage VD_sense falls below the center voltage Vcenter after the first valley. Further, the output of the signal Valley_detect first becomes High for a constant period at a time t3 at which a time Tdelay has elapsed from t2. At a time t_on at which a cycle limiting time Tsw elapses from when the switching element 50 was turned ON last time, and the signal Valley_detect is outputted, a voltage VDRV is applied at High to turn ON the switching element 50.

According to the configurations described with reference to FIGS. 8 to 11 as described above, the valley timing can be detected by the more inexpensive configuration as compared with the method for monitoring the voltage of the externally-attached auxiliary wiring to thereby detect the valley timing in the ringing generated in the drain voltage of the switching element 50. Further, when a differentiation circuit is used to try to detect the valley timing, a limitation occurs in the frequency at which the valley timing can be detected according to the capacitance value in the differentiation circuit. However, according to the configurations described with reference to FIGS. 8 to 11, the valley timing can be detected without any limitation to the frequency of the ringing.

Conclusion

It is to be appreciated that the Detailed Description section, and not the Summary and Abstract sections (if any), is intended to be used to interpret the claims. The Summary and Abstract sections (if any) may set forth one or more but not all exemplary embodiments of the invention as contemplated by the inventor(s), and thus, are not intended to limit the invention or the appended claims in any way.

While the invention has been described herein with reference to exemplary embodiments for exemplary fields and applications, it should be understood that the invention is not limited thereto. Other embodiments and modifications thereto are possible, and are within the scope and spirit of the invention. For example, and without limiting the generality of this paragraph, embodiments are not limited to the software, hardware, firmware, and/or entities illustrated in the figures and/or described herein. Further, embodiments (whether or not explicitly described herein) have significant utility to fields and applications beyond the examples described herein.

Embodiments have been described herein with the aid of functional building blocks illustrating the implementation of specified functions and relationships thereof. The boundaries of these functional building blocks have been arbitrarily defined herein for the convenience of the description. Alternate boundaries can be defined as long as the specified functions and relationships (or equivalents thereof) are appropriately performed. Also, alternative embodiments may perform functional blocks, steps, operations, methods, etc. using orderings different than those described herein.

References herein to "one embodiment," "an embodiment," "an example embodiment," or similar phrases, indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it would be within the knowledge of persons skilled in the relevant art(s) to incorporate such feature, structure, or characteristic into other embodiments whether or not explicitly mentioned or described herein.

The breadth and scope of the invention should not be limited by any of the above-described exemplary embodiments, but should be defined only in accordance with the following claims and their equivalents.

What is claimed is:

1. A circuit comprising:
    a first holder configured to hold a peak voltage of an oscillating signal that is based on a voltage at a terminal of an inductor coupled to a switching element;
    a second holder configured to hold a valley voltage of the oscillating signal;
    a generator configured to generate a center voltage based on the peak voltage and the valley voltage;
    a monitor configured to monitor a present value of the voltage at the terminal; and
    a detector configured to detect, as a valley timing, a timing at which a predetermined delay time has elapsed from a timing at which the monitored present value has fallen below the center voltage.

2. The circuit of claim 1, further comprising a voltage divider configured to divide the voltage at the terminal, wherein a divided voltage is an output from the voltage divider.

3. The circuit of claim 1, further comprising a driver configured to output a signal for turning ON the switching element when the valley timing is detected by the detector.

4. The circuit of claim 3, wherein a delay time used in an Nth (where N is an integer of 3 or more) cycle of switching cycles, which are cycles of repetition of turning ON and OFF of the switching element, is adjusted based on monitored voltage values in the valley timing detected in previous cycles of the switching cycles.

5. The circuit of claim 4, wherein the delay time is adjusted to be increased or decreased based on a comparison result of the monitored voltage values in the valley timing detected in the previous cycles of the switching cycles.

6. The circuit of claim 5, wherein when a monitored voltage value in the valley timing detected in an N−1th cycle is higher than a monitored voltage value in the valley timing detected in an N−2th cycle, the delay time is adjusted in a different direction from adjustment in the N−1th cycle.

7. The circuit of claim 5, wherein when a monitored voltage value in the valley timing detected in an N−1th cycle is lower than a monitored voltage value in the valley timing detected in an N−2th cycle, the delay time is adjusted in a same direction as adjustment in the N−1th cycle.

8. The circuit of claim 3, wherein the driver outputs the signal for turning ON the switching element when a predetermined time has elapsed since the last time the signal was outputted and the valley timing is detected by the detector.

9. The circuit of claim 3, wherein the switching element is a MOSFET.

10. The circuit of claim 9, wherein a delay time used in an Mth (where M is an integer of 1 or more) cycle of switching cycles, which are cycles of repetition of turning ON and OFF of the switching element, is a time based on an inductance of the inductor and a drain capacitance of the MOSFET.

11. A method comprising:
    holding a peak voltage of an oscillating signal that is based on a voltage at a terminal of an inductor coupled to a switching element;
    holding a valley voltage of the oscillating signal;
    generating a center voltage based on the peak voltage and the valley voltage;
    monitoring a present value of the voltage at the terminal; and
    detecting, as a valley timing, a timing at which a predetermined delay time has elapsed from a timing at which the monitored present value has fallen below the center voltage.

12. The method of claim 11, further comprising dividing the voltage at the terminal and outputting a divided voltage.

13. The method of claim 11, further comprising outputting a signal for turning ON the switching element when the valley timing is detected.

14. The method of claim 13, further comprising adjusting a delay time used in an Nth (where N is an integer of 3 or more) cycle of switching cycles, which are cycles of repetition of turning ON and OFF of the switching element, based on monitored voltage values in the valley timing detected in previous cycles of the switching cycles.

15. The method of claim 14, wherein the delay time is adjusted to be increased or decreased based on a comparison result of the monitored voltage values in the valley timing detected in the previous cycles of the switching cycles.

16. The method of claim 15, wherein when a monitored voltage value in the valley timing detected in an N−1th cycle is higher than a monitored voltage value in the valley timing detected in an N−2th cycle, the delay time is adjusted in a different direction from adjustment in the N−1th cycle.

17. The method of claim 15, wherein when a monitored voltage value in the valley timing detected in an N−1th cycle is lower than a monitored voltage value in the valley timing detected in an N−2th cycle, the delay time is adjusted in a same direction as adjustment in the N−1th cycle.

18. The method of claim 13, wherein the signal for turning ON the switching element is outputted when a predetermined time has elapsed since the last time the signal was outputted and the valley timing is detected.

19. The method of claim 13, wherein the switching element is a MOSFET.

20. The method of claim 19, further comprising determining a delay time used in an Mth (where M is an integer of 1 or more) cycle of switching cycles, which are cycles of repetition of turning ON and OFF of the switching element, based on an inductance of the inductor and a drain capacitance of the MOSFET.

* * * * *